United States Patent
Singh et al.

(10) Patent No.: US 7,318,210 B1
(45) Date of Patent: Jan. 8, 2008

(54) METHOD AND APPARATUS FOR PERFORMING INCREMENTAL PLACEMENT FOR LAYOUT-DRIVEN OPTIMIZATIONS ON FIELD PROGRAMMABLE GATE ARRAYS

(75) Inventors: Deshanand P. Singh, Mississauga (CA); Stephen D. Brown, Toronto (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 11/505,038

(22) Filed: Aug. 16, 2006

Related U.S. Application Data

(63) Continuation of application No. 10/617,502, filed on Jul. 11, 2003.

(51) Int. Cl.
*G06F 17/50* (2006.01)

(52) U.S. Cl. .................. 716/9; 716/2; 716/17
(58) Field of Classification Search ............ None
See application file for complete search history.

(56) References Cited

U.S. PATENT DOCUMENTS

| | | | | |
|---|---|---|---|---|
| 5,224,056 A | * | 6/1993 | Chene et al. ............... 716/7 |
| 5,341,308 A | * | 8/1994 | Mendel ..................... 716/7 |
| 5,521,837 A | * | 5/1996 | Frankle et al. ............ 716/10 |
| 5,838,584 A | * | 11/1998 | Kazarian .................. 716/16 |
| 6,099,583 A | * | 8/2000 | Nag ......................... 716/16 |
| 6,102,964 A | * | 8/2000 | Tse et al. .................. 716/18 |
| 6,212,668 B1 | * | 4/2001 | Tse et al. .................. 716/7 |
| 6,631,508 B1 | * | 10/2003 | Williams .................. 716/8 |
| 6,779,169 B1 | * | 8/2004 | Singh et al. .............. 716/16 |
| 6,871,336 B1 | * | 3/2005 | Anderson ................. 716/9 |

OTHER PUBLICATIONS

Choy et al., "Incremental Layout Placement Modification Algorithms," IEEE Trans. on CAD of ICs & Systems, vol. 15, No. 4, Apr. 1996, pp. 437-445.*

Singh et al., "Incremental Placement for Layout-Driven Optimizations on FPGAs," IEE/ACM 2002 Int'l Conf. on CAD, pp. 752-759.*

Togawa et al., "An Incremental Placement and Global Routing Algorithm for Field-Programmable Gate Arrays," 1998 IEEE Design Automation Conference, pp. 519-526.*

* cited by examiner

*Primary Examiner*—Leigh M. Garbowski
(74) *Attorney, Agent, or Firm*—L. Cho

(57) ABSTRACT

A method for designing a system on a target device utilizing field programmable gate arrays (FPGAs) includes placing new logic elements (LEs) at preferred locations on a layout of an existing system. Illegalities in placement of the new LEs are resolved.

26 Claims, 10 Drawing Sheets

METHOD AND APPARATUS FOR PERFORMING INCREMENTAL PLACEMENT FOR LAYOUT-DRIVEN OPTIMIZATIONS ON FIELD PROGRAMMABLE GATE ARRAYS

RELATED APPLICATIONS

This is a continuation application of application Ser. No. 10/617,502, entitled "Method and Apparatus for Performing Incremental Placement for Layout-Driven Optimizations on Field Programmable Gate Arrays", filed Jul. 11, 2003.

FIELD OF THE INVENTION

The present invention relates to the field of field programmable gate arrays (FPGAs). More specifically, the present invention relates to a method and apparatus for performing incremental placement for layout-driven optimizations on systems on FPGAs using tools such as electronic design automation (EDA) tools.

BACKGROUND

FPGAs may be used to implement large systems that include millions of gates and megabits of embedded memory. Of the tasks required in managing and optimizing a design, placement of components on the FPGAs and routing connections between components on the FPGA utilizing available resources can be the most challenging and time consuming. In order to satisfy placement and timing specifications, several iterations are often required to determine how components are to be placed on the target device and which routing resources to allocate to the components. The complexity of large systems often requires the use of EDA tools to manage and optimize their design onto physical target devices. Automated placement and routing algorithms in EDA tools perform the time consuming task of placement and routing of components onto physical devices.

The design of a system is often impacted by the connection delays routed along the programmable interconnect of the target device. The interconnect provides the ability to implement arbitrary connections, however, it includes both highly capacitive and resistive elements. The delay experienced by a connection is affected by the number of routing elements used to route the connection. These delays are often only fully known after the placement and routing phases of the FPGA computer automated design (CAD) flow. When modifications are made to a system in order to reduce delays, current EDA tools require a re-work of the entire placement procedure. This may require a significant amount of additional time which is inefficient and undesirable.

Thus, what is needed is an efficient method and apparatus for performing incremental placement for layout-driven optimizations on FPGAs.

SUMMARY

According to an embodiment of the present invention, a method and apparatus is disclosed to support incremental placement of new components created by layout-driven circuit restructuring techniques onto an existing placement on an FPGA. Placement of the new components is attempted at preferred locations that are identified. If illegalities in placement exist, non-critical components are shifted in order to satisfy the preferred locations. According to an embodiment of the present invention, illegalities in placement are evaluated using a cost function that measures architectural violations, timing, and wirelength cost. The cost function may be modified in order to help the placement escape a local minimum.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
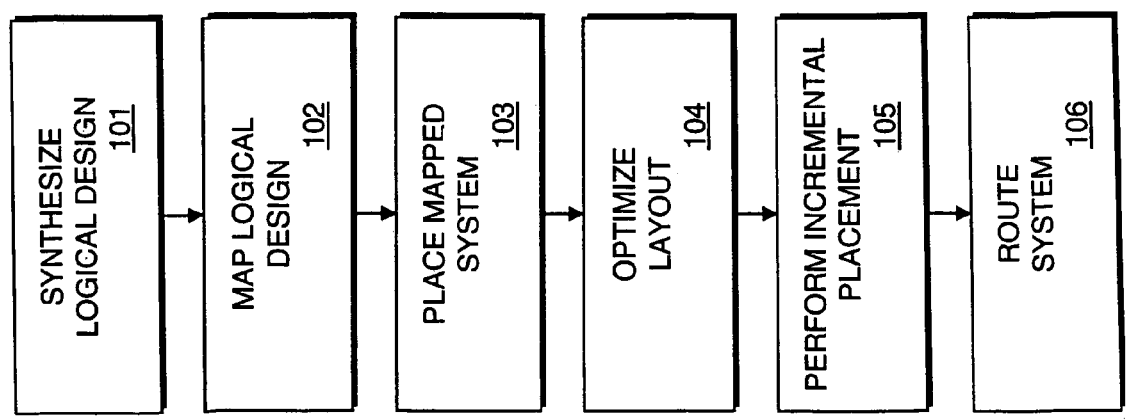
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

Figure 2:
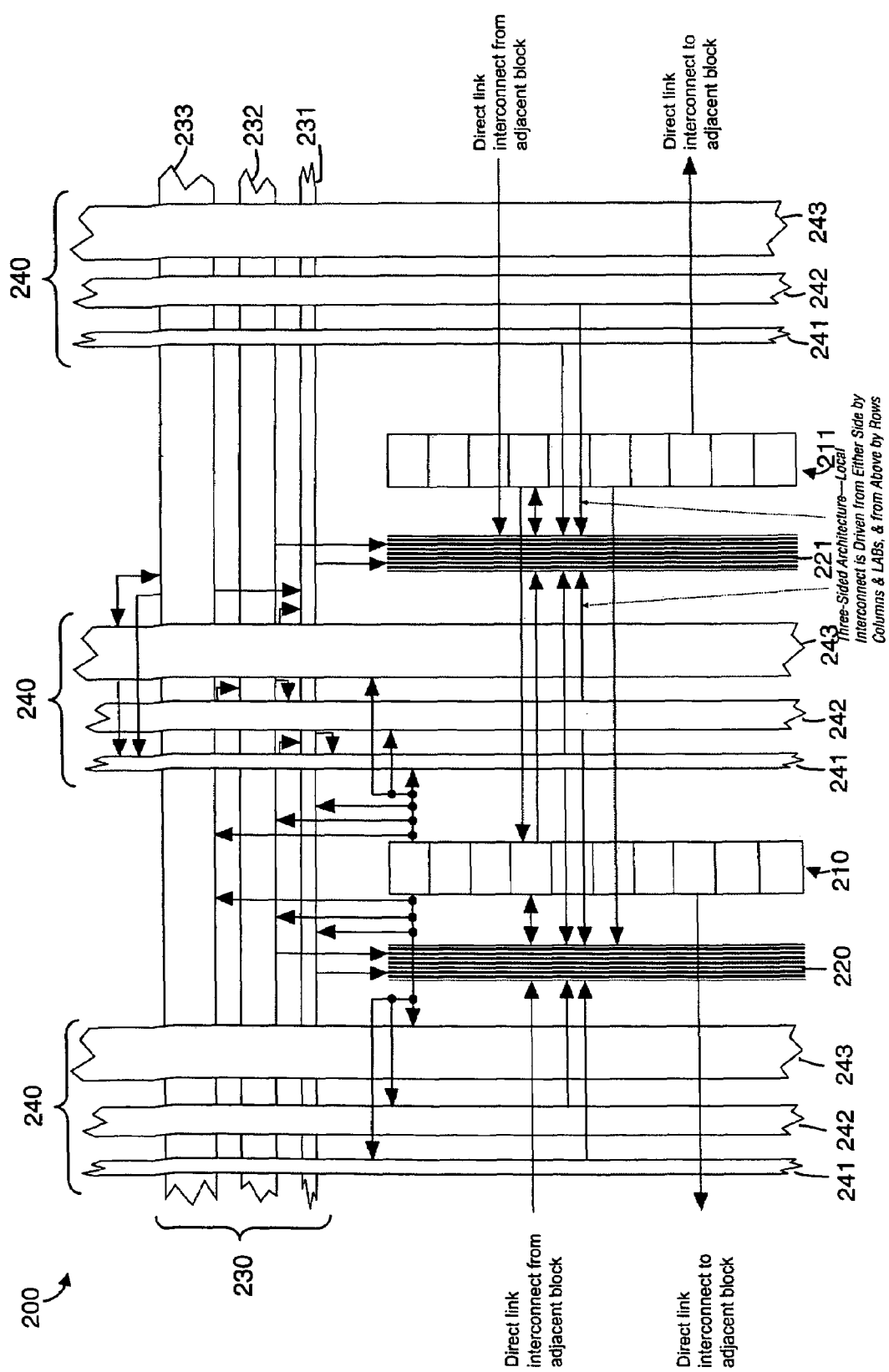
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop.

The target device 200 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220-221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220-221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include components other than those described in reference to the target device 200. Thus, while the invention described herein may be utilized on the architecture described in FIG. 2, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Figure 3:
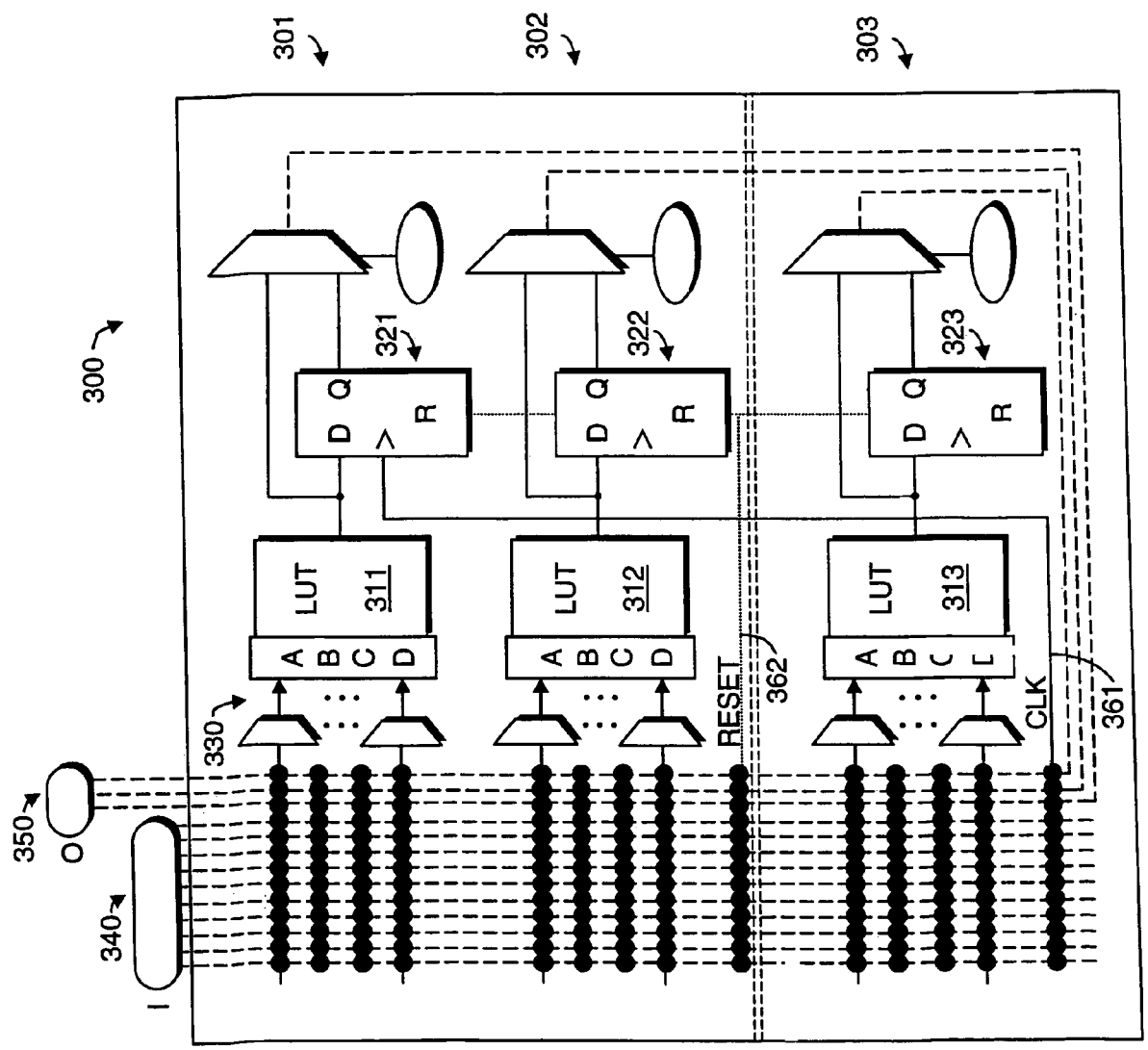
FIG. 3 illustrates a LAB according to an embodiment of the present invention.

FIG. 3 illustrates a LAB or clustered logic block 300 according to an embodiment of the present invention. The LAB 300 may be used to implement any of the LABs shown in FIG. 2. LEs 301-303 illustrates a first, second, and tenth LE in the LAB 300. The LEs 301-303 each have a 4-input lookup table 311-313, respectively, and a configurable register 321-323s, respectively, connected at its output. The LAB 300 includes a set of input pins 340 and a set of output pins 350 that connect to the general-purpose routing fabric so that LAB can communicate with other LABs. The inputs to lookup tables 311-313 can connect to any one of the input pins 340 and output pins 350 using the appropriate configuration bits for each of the multiplexers 330. The number of LEs, $n_E$, input pins, $n_I$, and output pins, $n_O$ in a LAB impose important architectural constraints on a system. In addition, since a single clock line 361 and a single asynchronous set/reset line 362 is attached to each configurable register 321-323, the configurable registers 321-323 must be clocked by the same signal and initialized by the same signal. The number of clock lines available in a LAB is represented by $n_C$. The number of reset lines available in a LAB is represented by $n_R$.

Referring back to FIG. 1, at 102, the optimized logical design of the signal is mapped. Mapping includes determining how to implement components such as logic gates and logic elements in the optimized logic representation with specific resources on a target device. According to an embodiment of the present invention, a netlist is generated from mapping. The netlist illustrates how the resources of the target device are utilized to implement the system. The netlist may, for example, include a representation of the components on the target device and how the components are connected.

At 103, the mapped logical system design is placed. Placement includes fitting the system on the target device by determining which resources on the target device is to be used for specific logic gates, logic elements, and connections between components. The placement procedure may be performed by a placer in an EDA tool that utilizes placement algorithms. According to an embodiment of the present invention, a user (designer) may provide input to the placer by specifying placement constraints. The constraints may include defining logic regions that group certain components of a system together. The components may be for example, digital logic, memory devices, or other components. The size of the logic regions may be determined by the user or by a sizing method. The placement of the logic regions may be determined by the user or by a placement method.

At 104, layout-driven optimizations are performed. According to an embodiment of the present invention, routing delays for the connections on the netlist are estimated by calculating a fastest possible route. Timing-driven netlist optimization techniques may be applied to perturb the netlist to reduce the critical path(s). The netlist may be perturbed by the EDA tool performing the synthesis, mapping and placement. Alternatively, the netlist may be perturbed by a user of the EDA tool, or by a third party. Perturbing the netlist may include adding, deleting, or moving components. According to an embodiment of the present invention, preferred locations are identified for the components that have been added or moved from the layout-driven optimization. The locations assigned to components of the existing system from the placement procedure are identified as preferred locations for the components.

At 105, incremental placement is performed. The changes to the netlist generated from layout-driven optimization are placed on the layout of the existing system placed at 103. Incremental placement involves evaluating resources on a target device such as LABs that have architectural violations or illegalities from layout-driven optimizations. Incremental placement attempts to perturb the preferred locations as little as possible to ensure that the final placement respects all architectural constraints. Incremental placement attempts to identify non-critical LEs that may be moved from their preferred locations to resolve architectural violations in order that truly critical elements may stay at their preferred locations. Incremental placement may be performed by an incremental placement engine (not shown) in the EDA tool that utilizes incremental placement algorithms.

In performing incremental placement, an architectural description of the target device, A, and a netlist, N(E,C), that includes a set of logic elements, E, and a set of connections, C, is processed. Each element, e, is associated with a preferred physical location, $(p_x(e), p_y(e))$. According to an embodiment of the present invention, all atoms of the netlist have a preferred location. Incremental placement generates a set of mapped locations, M, for each logic elements in N. Incremental placement tries to find a mapping from preferred locations to mapped locations, P→M, such that the mapped locations are architecturally feasible as well as being minimally disruptive. The definition of minimal disruption depends on the goal of netlist optimization.

According to an embodiment of the present invention, the goal of netlist optimization is to optimize timing of the system. In this embodiment, T(S) represent an estimate of the critical path delay if all logic elements in E are mapped to $(s_x(e), s_y(e))$. The estimate may ignore the legality of locations and may be computed assuming a best case route is possible for each connection. In this example, P→M is minimally disruptive if incremental placement minimizes {T(M)−T(P)}. Any logic element can be moved from its preferred location as long as it does not degrade the critical path. According to one embodiment, routing area is also tracked to control excessive routing congestion. In this embodiment, A(S) represents the routing area consumed if the logic elements are mapped to $(s_x(e), s_y(e))$. Minimal disruptiveness is satisfied by minimizing the relationships shown below.

{T(M)−T(P)}+{A(M)−A(P)}  (1)

Figure 4:
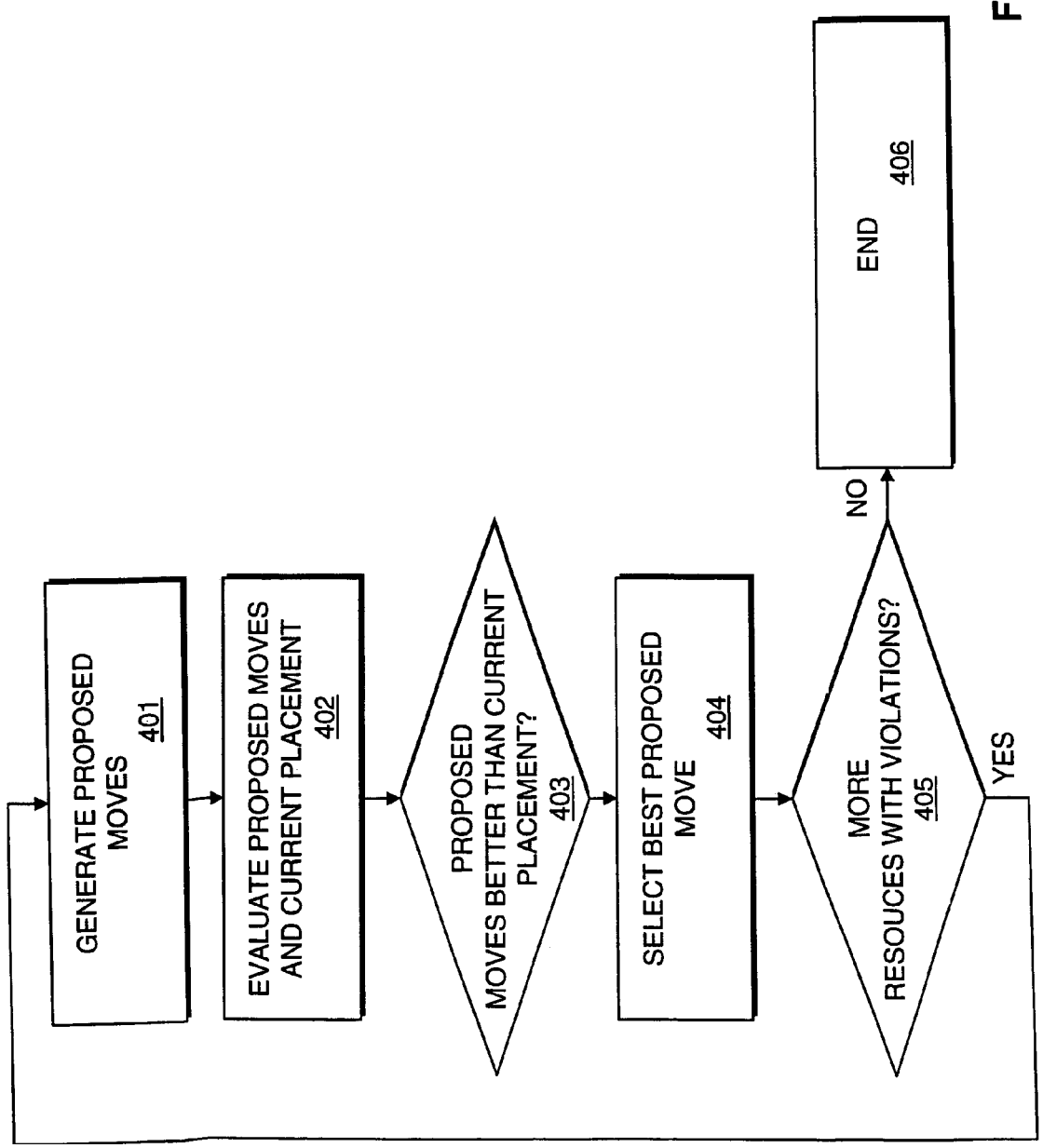
FIG. 4 is a flow chart illustrating a method for performing incremental placement according to an embodiment of the present invention.

FIG. 4 is a flow chart illustrating a method for performing incremental placement according to an embodiment of the present invention. The method described in FIG. 4 may be used to perform incremental placement as shown as 105 in FIG. 1. At 401 proposed moves for all LEs in a LAB having architectural violations are generated. According to an embodiment of the present invention, proposed moves may include a move-to-fanin, move-to-fanout, move-to-sibling, move-to-neighbor, move-to-space, a move towards a critical vector, and other moves. A move-to-fanin involves moving an LE to a LAB that is a fanin of the LE. A move-to-fanout involves moving an LE to a LAB that is a fanout of the LE. A move-to-sibling involves moving an LE to a LAB that is fanout of a LAB that fans in to the LAB of the LE.

Figure 5:
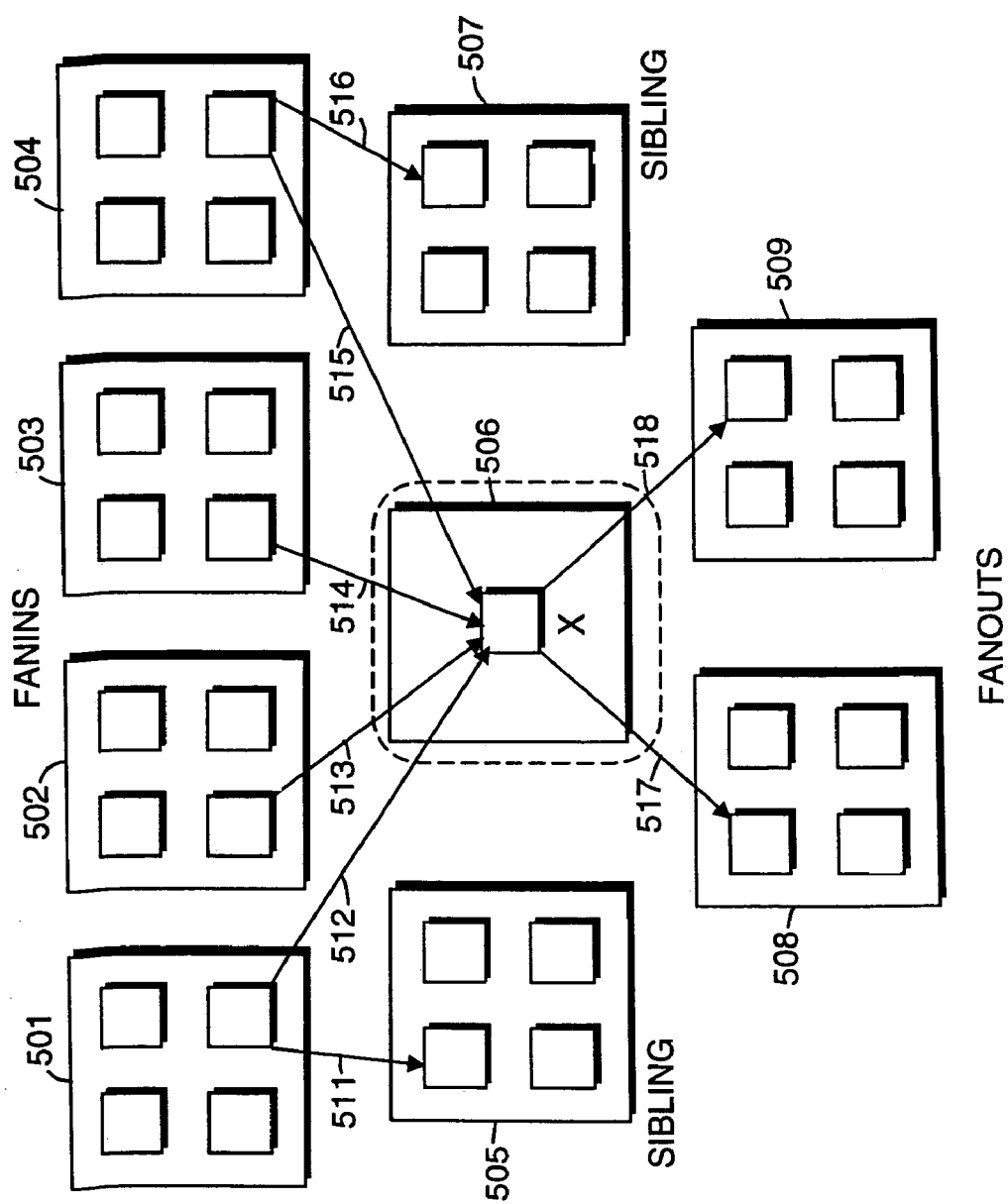
FIG. 5 illustrates fanin, fanout, and sibling relationship move proposals according to an embodiment of the present invention.

FIG. 5 illustrates examples of a move-to-fanin, move-to-fanout, and move-to-sibling. When a first LE in a first LAB transmits a signal to a second LE in a second LAB, the first LAB is said to be a fanin of the second LE. When a first LE in a first LAB receives a signal from a second LE in a second LAB, the first LAB is said to be a fanout of the second LE. When a first LE from a first LAB receives a signal from a second LE from a second LAB that also transmits to a third LE in a third LAB, the first LAB and the third LABs are said to be siblings. Blocks 501-509 illustrates a plurality of LABs. Each of the LABs 501-509 has a number of shown LEs. A plurality of arrows 511-518 are shown to illustrate the direction of a signal transmitted between LEs. Relative to LAB 506, LABs 501-504 are considered fanins, LABs 505 and 507 are considered siblings, and LABs 508 and 509 are considered fanouts.

Figure 6:
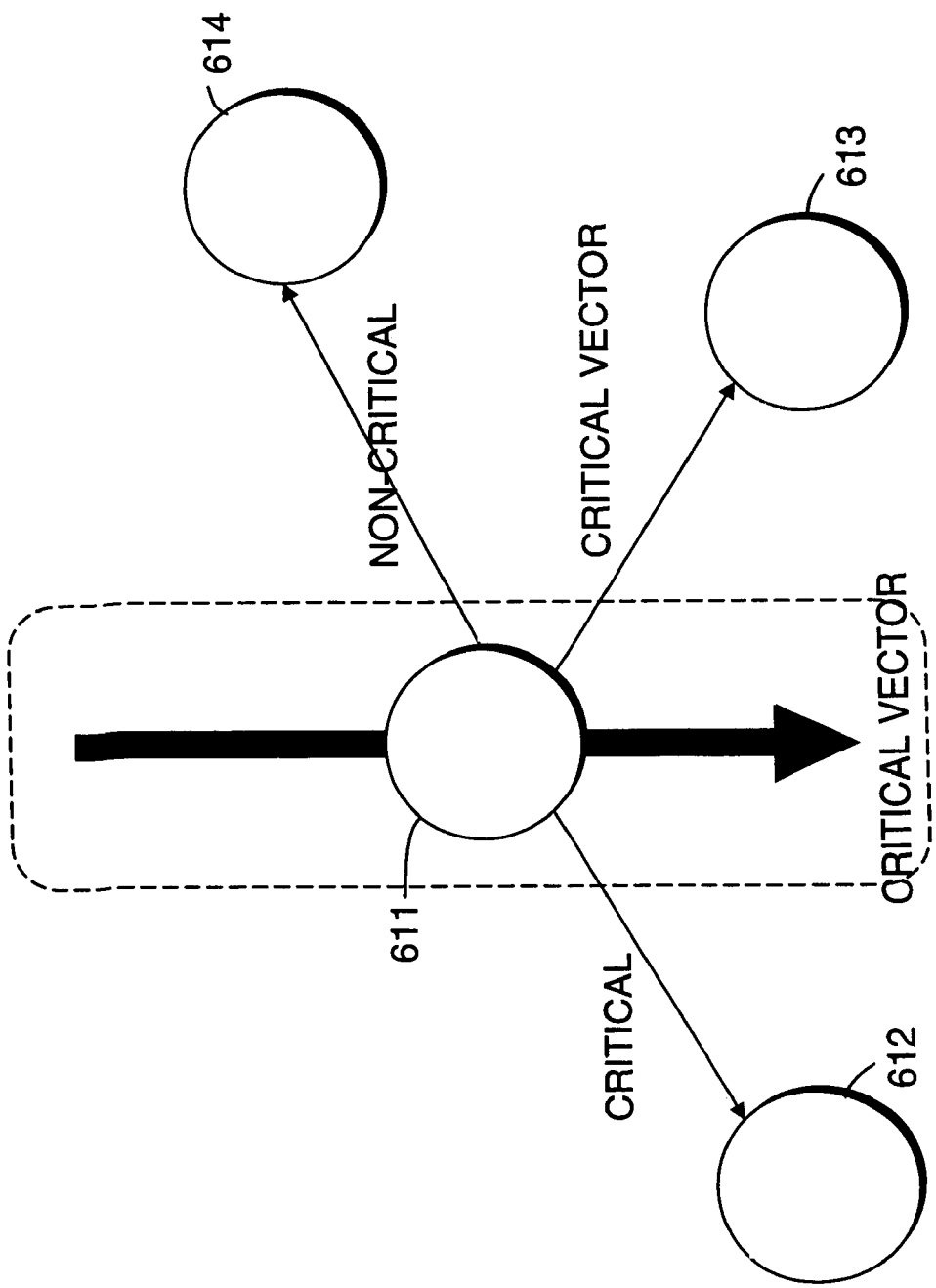
FIG. 6 illustrates an exemplary critical vector move proposal according to an embodiment of the present invention.

Proposed moves may also include move-to-neighbor, move-to-space, and move towards critical vector. A move-to-neighbor involves moving an LE to an adjacent LAB. A move-to-space involves a move to any random free LE location in a target device. A move towards critical vector involves moving an LE towards a vector that is computed by summing the directions of all critical connections associated with the moving LE. FIG. 6 illustrates an exemplary critical vector 601. Vector 601 is the critical vector of LE 611 which has critical connections to LEs 612 and 613, and a non-critical connection with LE 614.

Referring back to FIG. 4, at 402, a current placement of LEs in a LAB with architectural violations and proposed moves of the LEs in the LAB are evaluated by a cost function. The cost function may include parameters which measure the legality of a LAB (cluster legality cost), timing (timing cost), and an amount of routing resources that is required for a placement (wirelength cost). According to an embodiment of the present invention, the cost function guides the reduction of architectural violations while ensuring minimal disruption. This cost function, C, is illustrated with the relationship shown below.

$C = K_L * \text{ClusterCost} + K_T * \text{TimingCost} * K_W * \text{WirelengthCost}$  (2)

$K_L$, $K_T$, and $K_W$ represent weighting coefficients that normalize the contributions of each parameter. It should be appreciated that other parameters may be used in addition to or in place of the parameters described.

The cluster legality cost is a cost associated with each LAB $CL_i$. This cost may be represented as shown below.

$$\text{ClusterCost}(CL_i) = kE_i * \text{legality}(CL_i, n_E) + \qquad (3)$$
$$KI_i * \text{legality}(CL_i, n_I) +$$
$$kR_i * \text{legality}(CL_i, n_R) +$$
$$kO_i * \text{legality}(CL_i, n_O) +$$
$$kC_i * \text{legality}(CL_i, n_C)$$

The legality $(CL_i, \ldots)$ function returns a measure of legality for a particular constraint. A value of O indicates legality, while any positive value is proportional to the amount to which the constraint has been violated. Functions legality $(CL_i, n_E)$, legality $(CL_i, n_I)$, legality $(CL_i, n_O)$, legality $(CL_i, n_R)$, and legality $(CL_i, n_C)$ evaluate if LAB $CL_i$ has a feasible number of logic elements, inputs, outputs, reset lines and clock lines, respectively. According to an embodiment of the present invention, the weighting coefficients $kE_i$, $KI_i$, $kO_i$, $kR_i$, and $kC_I$ are all initially set to 1 for every LAB $CL_i$ in the target device.

The timing cost associated with a placement may be represented as shown below.

$$\text{TimingCost} = TC_{VPR} + k_{DAMP} * TC_{DAMP} \quad (4)$$

The first parameter, $TC_{VPR}$, is based upon the cost used by a versatile placement and routing (VPR) placer. This cost may be represented with the following relationship.

$$TC_{VPR} = \Sigma_c \text{crit}(c) * \text{delay}(c) \quad (5)$$

This function encourages critical connections to reduce delay while allowing non-critical connections to optimize wirelength and other optimization criteria.

The second parameter, $TC_{DAMP}$, operates as a damping component of the timing cost function and can be represented with the following relationships.

$$TC_{DAMP} = \Sigma_c \max(\text{delay}(c) - \text{maxdelay}(c), 0.0) \quad (6)$$

$$\text{maxdelay}(c) = \text{delay}(c) + \alpha * \text{slack}(c) \quad (7)$$

The damping component penalizes any connection c whose delay(c) exceeds a maximum value maxdelay(c). This allows arbitrary moves to be made along a plateau defined by the maximum delays. The maxdelay values may be updated every time a timing analysis of the system is executed. The maxdelay values are controlled by the slack on the connection considered. The parameter α determines how much of a connection's slack will be allocated to the delay growth of the connection. Thus, the plateau is defined by the connection slack so that connection with large amounts of slack are free to move large distances in order to resolve architectural violations, while small slack values are relatively confined.

Figure 7:
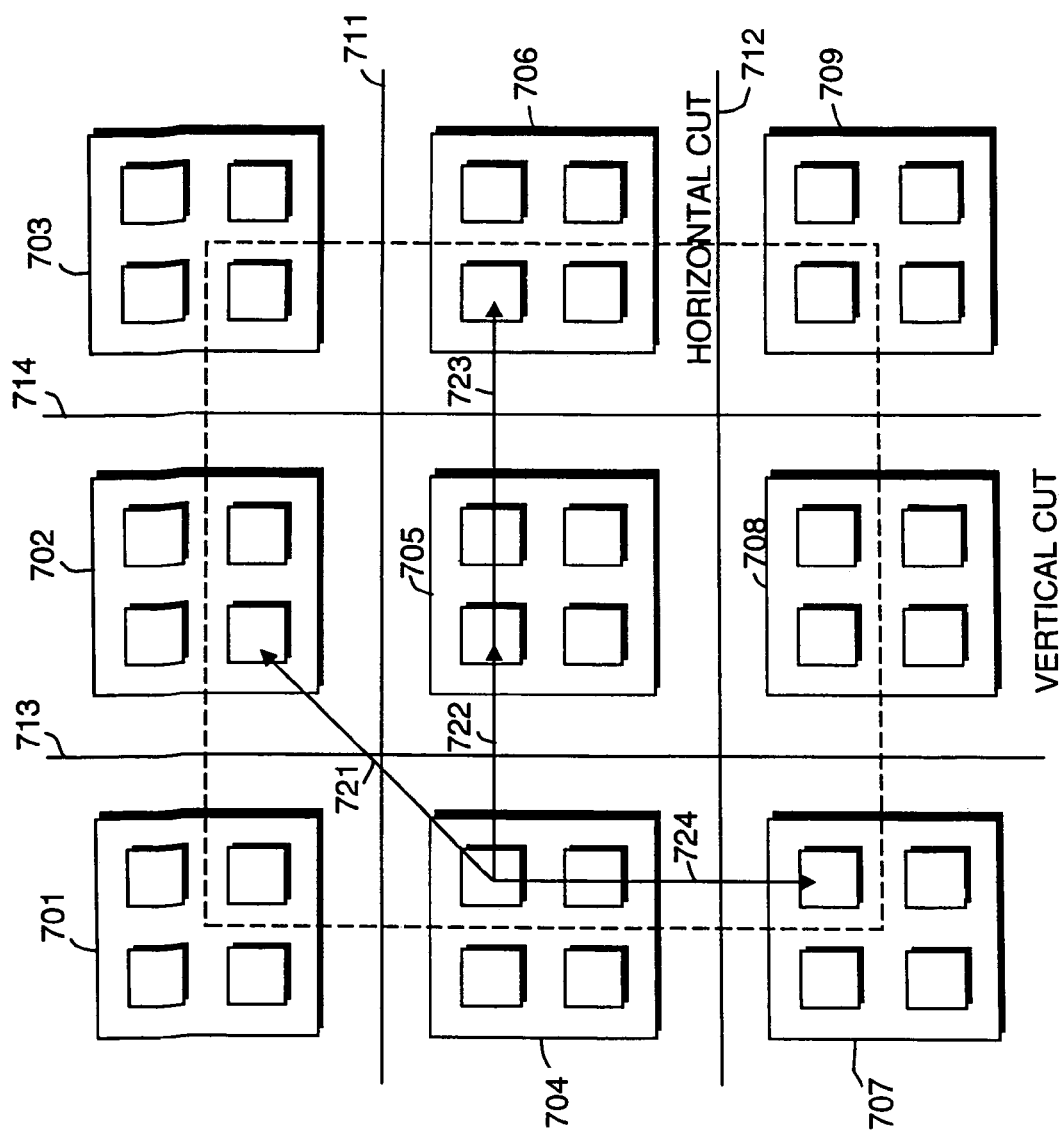
FIG. 7 illustrates horizontal and vertical cut-lines used for local congestion estimation according to an embodiment of the present invention.

Wirelength cost of a placement may be measured by determining a number of routing wires that cross cut-lines that outline a LAB. FIG. 7 illustrates the utilization of cut-lines according to an embodiment of the present invention. Blocks 701-709 represent LABs having a plurality of shown LEs. Horizontal cut-lines 711 and 712 and vertical cut-lines 713 and 714 are placed in each horizontal channel of a target device. Cut-lines provide a method to measure congestion by finding the regions that have the largest number of routing wires 721-724. This measurement may be used to prevent the formation of localized congested areas that can cause circuitous routes. The total number of routing wires that intersect a particular cut may be calculated by finding all the signals that intersect a particular cut-line and summing the average crossing-count for each of these signal wires. The average crossing count for a signal may be computed using the following relationship.

$$\text{CrossingCount(net)} = q(\text{NumCLBlockPins(net)}) \quad (8)$$

The function q is given as a number of discrete crossing counts as a function of signal pin count. The argument to the function q is the number of clustered logic block pins used to wire the signal. With respect to the functions shown in (3)-(8), it should be appreciated that other types of functions may be used in addition or in place of the functions represented.

Referring back to FIG. 4, at 403, it is determined whether the cost associated with any of the proposed moves is better than the cost associated with the current placement. The costs associated with the proposed moves and current placement may be obtained by using cost function values generated from using the cost function described with respect to 402. If it is determined that the cost associated with any of the proposed moves is better than the cost associated with the current placement, control proceeds to 404. If it is determined that the cost associated with any of the proposed moves is not better than the cost associated with the current placement, control proceeds to 405.

At 404, the proposed move associated with the best cost is selected as the current placement.

At 405, it is determined whether any additional LABs in the system have architectural violations. If additional LABs in the system have architectural violations, control will move to one of these LABs and proceeds to 401. If no additional LABs in the system have architectural violations, control proceeds to 406 and terminates the procedure. According to an embodiment of the present invention, a counter may be used to track the number of proposed moves that have been generated, or the number of LEs or LABs that have had proposed moves generated. In this embodiment, when this number exceeds a threshold value, instead of proceeding to 401, control terminates the procedure and returns an indication that a fit was not found.

Figure 8:
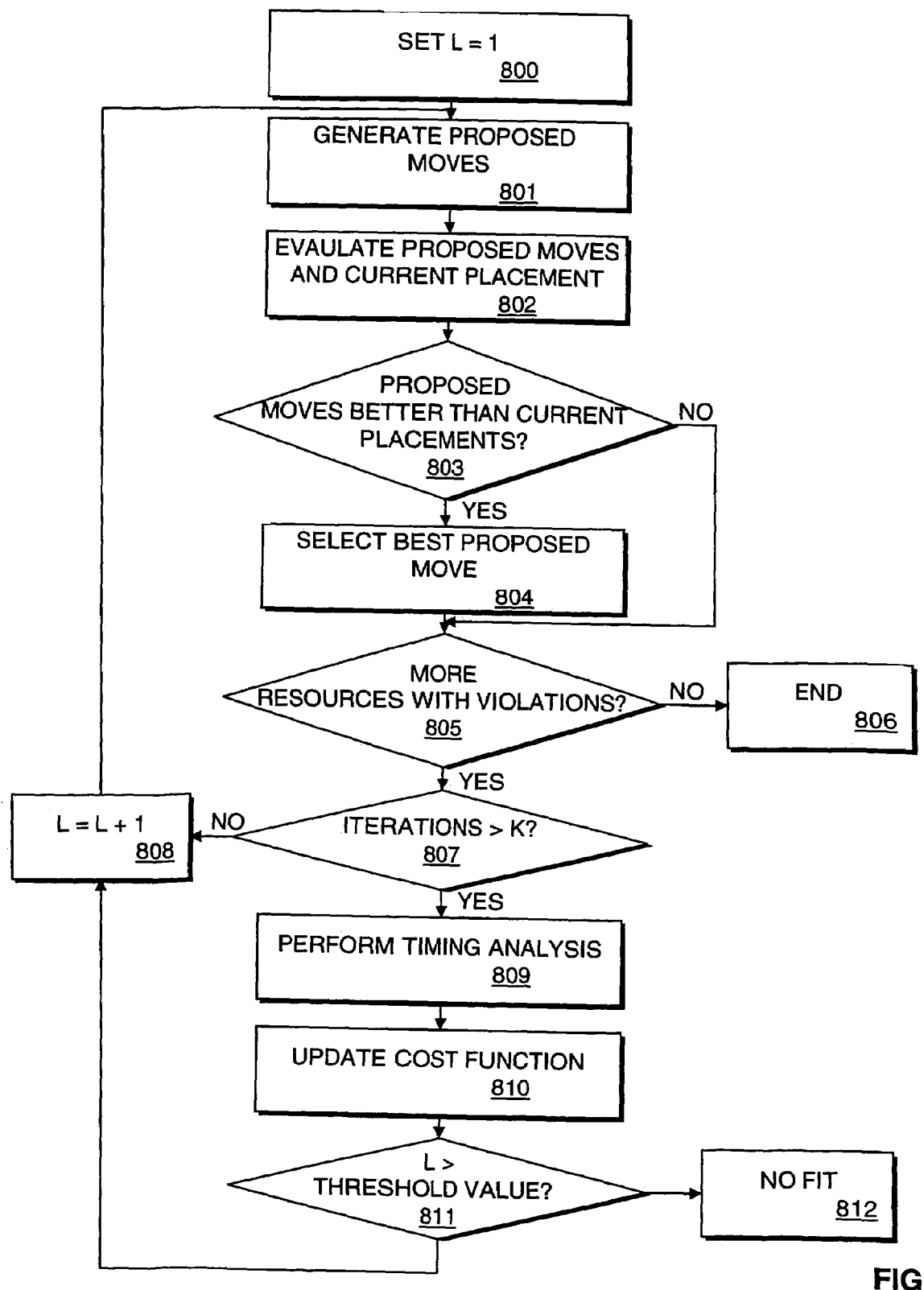
FIG. 8 is a flow chart illustrating a method for performing incremental placement utilizing directed hill-climbing according to an embodiment of the present invention.

FIG. 8 is a flow chart illustrating a method for performing incremental placement utilizing directed hill-climbing according to an embodiment of the present invention. The method described in FIG. 8 may be used to perform incremental placement as shown as 105 in FIG. 1. At 800, a loop iteration index, L, is set to 1.

At 801 proposed moves for all LEs in a LAB having architectural violations are generated. According to an embodiment of the present invention, the proposed moves may be generated similarly as described in 401 shown in FIG. 4. The number of LEs having proposed moves generated is recorded.

At 802, a current placement of LEs in a LAB with architectural violations and proposed moves of the LEs in the LAB are evaluated by a cost function. According to an embodiment of the present invention, the evaluation performed may be similarly conducted as described in 402 of FIG. 4.

At 803, it is determined whether the cost associated with any of the proposed moves is better than the cost associated with the current placement. The costs associated with the proposed moves and current placement may be obtained by using values generated from using the cost function described with respect to 402. If the cost associated with any of the proposed moves is better than the cost associated with the current placement, control proceeds to 804. If the cost associated with any of the proposed moves is not better than the cost associated with the current placement, control proceeds to 805.

At 804, the proposed move associated with the best cost is selected as the current placement.

At 805, it is determined whether any additional LABs in the system have architectural violations. If additional LABs in the system have architectural violations, control will move to one of these LABs and proceeds to 807. If no additional LABs in the system have architectural violations, control proceeds to 806 and terminates the procedure.

At 807, it is determined whether the number of LEs that have proposed moves generated exceeds the value K where K is a predefined value. If the number of LEs that have proposed moves generated exceeds the value K, control proceeds to 809. If the number of LEs that have proposed moves generated does not exceed the value K, control proceeds to 808.

At 808, the loop iteration index, L, is incremented. Control returns to 801.

At 809, timing analysis is performed. According to an embodiment of the present invention, the values for maxdelay and crit(c), used for evaluating timing cost, are updated to reflect the current configuration of the system.

At 810, the cost function is updated. According to an embodiment of the present invention, weighting coefficients in the ClusterCost parameter are incremented in proportion to an amount of violation. Updating the cost function allows directed hill-climbing to be performed. Directed hill-climbing is a technique that is used for generating proposed moves when moves cannot be found to decreases the current cost of a placement.

Figure 9:
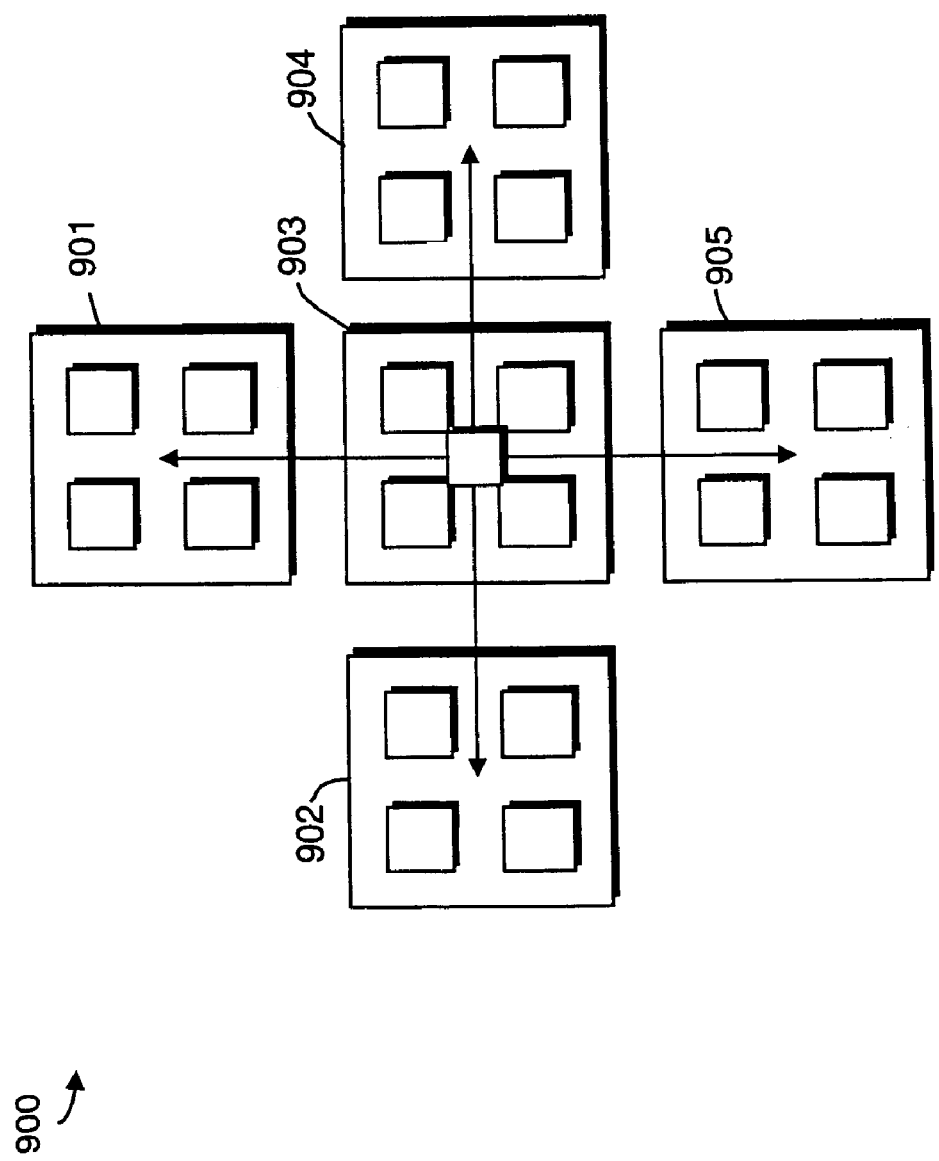
FIG. 9 illustrates a component trapped in a local minima according to an embodiment of the present invention.

FIG. 9 illustrates an example where directed hill-climbing may be applied. The target device 900 includes a plurality of LABs 901-905 each having a plurality of shown LEs. In this example, LAB 903 has one LE more than is allowed by its architectural specification. Every possible move attempt to resolve the architectural constraints of the center LAB 903 results in another architectural violation. If all architectural violations are costed in the same manner, then the method described in FIG. 4 may have difficulties resolving the constraint violation.

Figure 10:
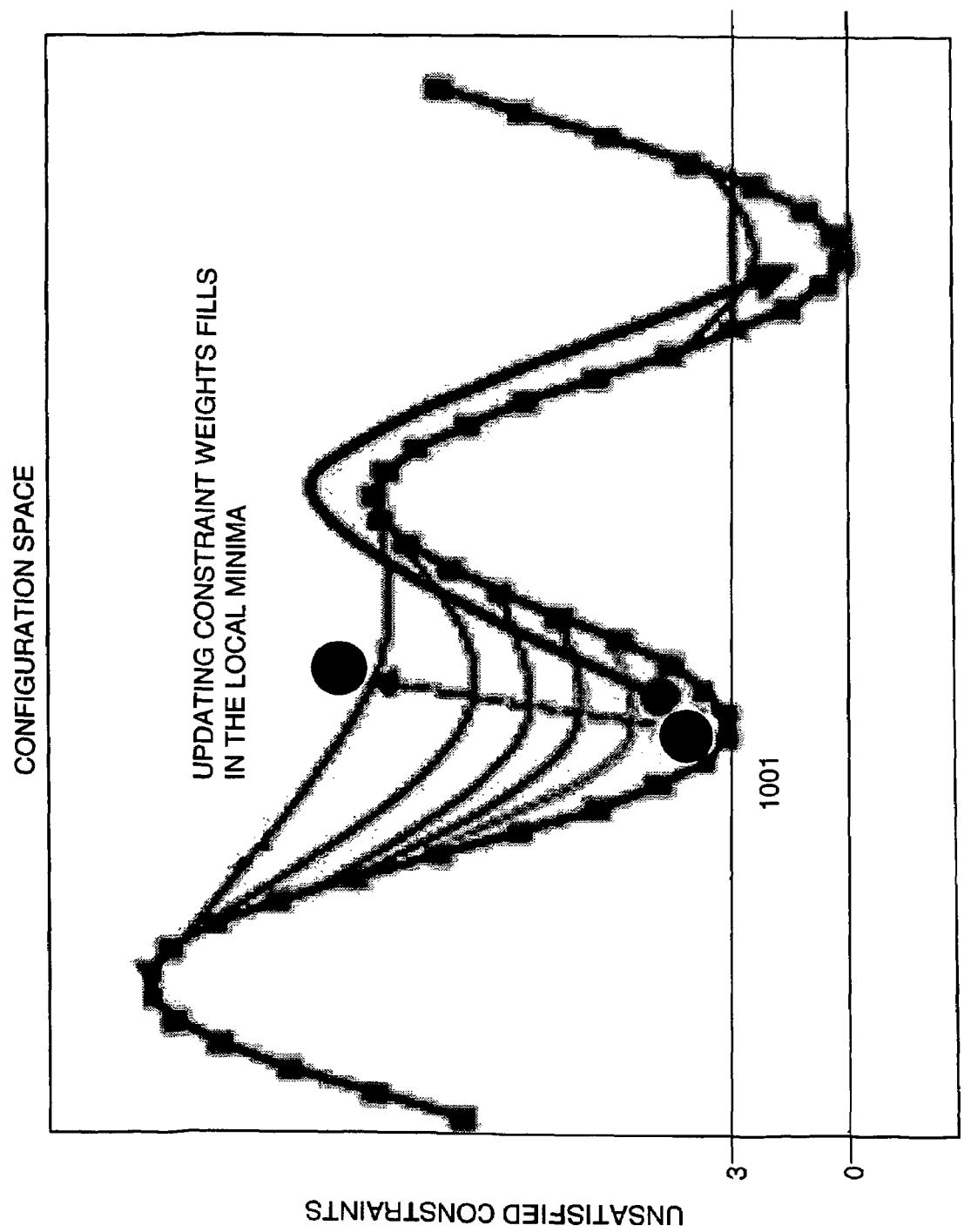
FIG. 10 illustrates basin-filling according to an embodiment of the present invention.

FIG. 10 illustrates a two dimensional slice of the multi-dimensional cost function described. The current state 1001 represents the situation shown in FIG. 9. No single move in the neighborhood of the current state finds a solution with a lower cost. However, the cost function itself could be modified to allow for the current state 1001 to climb the hill. The weighting coefficients of the cost function may be gradually increased for LABs that have unsatisfied constraints. A higher weight may be assigned to unsatisfied constraints that have been violated over a long period of time or over many iterations. This results in the cost function being reshaped to allow for hill climbing. The reshaping of the cost function has the effect of filling a basin where the local minima is trapped. Referring back to FIG. 9, once the weighting coefficients have been increased for LAB 903, a proposed move to one of the adjacent cluster may be made to allow for shifting the violation "outwards" to a free space.

Updating a cost function also allows for a quick convergence by preventing a phenomenon known as thrashing. Thrashing occurs when incremental placement is trapped in an endless cycle where an LE is moved between two points in the configuration space which both result in architectural violations. By increasing the cost or penalty for moving to the two points, a move to a third point would eventually be more desirable and accepted.

Referring back to FIG. 8, at 811, it is determined whether the loop index, L, is greater than a threshold value. If the loop index, L, is not greater than the threshold value, control proceeds to 808. If the loop index, L, is greater than the threshold value, control proceeds to 812.

At 812, control terminates the procedure and returns an indication that a fit was not found.

Referring back to FIG. 1, at 106, routing of the system is performed. During routing, routing resources on the target device are allocated to provide interconnections between logic gates, logic elements, and other components on the target device. The routing procedure may be performed by a router in an EDA tool that utilizes routing algorithms.

The incremental placement techniques disclosed allow logic changes to be incorporated into an existing system design without reworking placement of the entire system. The incremental placement techniques attempt to minimize disruption to the original placement and maintain the original timing characteristics. According to an embodiment of the present invention, a method for designing a system on a target device utilizing FPGAs is disclosed. The method includes placing new LEs at preferred locations on a layout of an existing system. Illegalities in placement of the components are resolved. According to one embodiment, resolving the illegalities in placement may be achieved by generating proposed moves for an LE, generating cost function values for a current placement of the LE and for placements associated with the proposed moves, and accepting a proposed move if its associated cost function value is better than the cost function value for the current placement.

FIGS. 1, 4 and 8 are flow charts illustrating a method for designing a system on a PLD, and methods for performing incremental placement. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described with respect to FIGS. 1, 4, and 5) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a target device utilizing field programmable gate arrays (FPGAs), comprising:
    placing new logic elements (LEs) at preferred locations on a layout of an existing system; and
    resolving illegalities in placement of the new LEs by generating a proposed move for an LE, generating cost function values for a current placement and a placement with the proposed move, and accepting the proposed move if its associated cost function value is better than the cost function value of the current placement.

2. A method for designing a system on a target device utilizing field programmable gate arrays (FPGAs), comprising:
    placing new logic elements (LEs) at preferred locations on a layout of an existing system; and
    resolving illegalities in placement of the new LEs by generating proposed moves for an LE,
    generating cost function values for a current placement and placements with the proposed moves, and
    accepting a proposed move if its associated cost function value is better than the cost function value for the current placement.

3. The method of claim 2, wherein generating the proposed moves comprises moving the LE to a logic-array block (LAB) that is a fanin of the LE.

4. The method of claim 2, wherein generating the proposed moves comprises moving the LE to a logic-array block (LAB) that is a fanout of the LE.

5. The method of claim 2, wherein generating the proposed moves comprises moving the LE to a logic-array block (LAB) that is a sibling of a LAB where the LE resides.

6. The method of claim 2, wherein generating the proposed moves comprises moving the LE to a logic-array block (LAB) that is adjacent to the LE.

7. The method of claim 2, wherein generating the proposed moves comprises moving the LE to any random free LE.

8. The method of claim 2, wherein generating the proposed moves comprises moving the LE in a direction of a critical vector.

9. The method of claim 2, wherein generating the cost function values comprises computing values using cluster legality as a parameter.

10. The method of claim 9, wherein the cluster legality is a function of a number of legal LEs in a LAB.

11. The method of claim 9, wherein the cluster legality is a function of a number of legal inputs in a LAB.

12. The method of claim 9, wherein the cluster legality is a function of a number of legal outputs in a LAB.

13. The method of claim 2, wherein generating the cost function values comprises computing values using timing cost as a parameter.

14. The method of claim 2, wherein generating the cost function values comprises computing values using wire length cost as a parameter.

15. The method of claim 2, further comprising modifying a cost function.

16. The method of claim 15, wherein modifying the cost function comprises increasing a penalty on a reoccurring illegality.

17. A method for designing a system on field programmable gate array (FPGAs), comprising:
determining placement of logic elements (LEs) for an existing system;
modifying a design for the existing system to improve performance by estimating routing delays for the existing system, and adding LEs to the existing system to reduce the routing delays;
placing new LEs from a modified design on the placement of LEs for the existing system; and
resolving illegalities in placement of the new LEs.

18. A method for designing a system on field programmable gate array (FPGAs), comprising:
determining placement of logic elements (LEs) for an existing system;
modifying a design for the existing system to improve performance;
placing new LEs from a modified design on the placement of LEs for the existing system; and
resolving illegalities in placement of the new LEs by generating proposed moves for an LE,
generating cost function values for a current placement and placements with the proposed moves, and
accepting a proposed move if its associated cost function value is better than a cost function value for the current placement.

19. The method of claim 18, wherein generating the cost function values comprises computing values using cluster legality as a parameter.

20. The method of claim 18, wherein generating the cost function values comprises computing values using timing cost as a parameter.

21. The method of claim 18, wherein generating the cost function values comprises computing values using wire length cost as a parameter.

22. The method of claim 18, further comprising modifying a cost function.

23. The method of claim 22, wherein modifying the cost function comprises increasing a penalty on a reoccurring illegality.

24. A machine-readable medium having stored thereon sequences of instructions, the sequences of instructions including instructions which, when executed by a processor, causes the processor to perform:
placing new logic elements (LEs) at preferred locations on a layout of an existing system; and
resolving illegalities in placement of the new LEs by generating proposed moves for an LE,
generating cost function values for a current placement and placements with the proposed moves, and
accepting a proposed move if its associated cost function value is better than the cost function value for the current placement.

25. The machine-readable medium of claim 24, wherein generating the cost function values comprises computing values using cluster legality as a parameter.

26. The machine-readable medium of claim 24, further comprising instructions, which when executed, causes the processor to further perform modifying a cost function by increasing a penalty on a reoccurring illegality.

* * * * *